(12) United States Patent
Majumder et al.

(10) Patent No.: US 7,941,776 B2
(45) Date of Patent: May 10, 2011

(54) METHOD OF IC DESIGN OPTIMIZATION VIA CREATION OF DESIGN-SPECIFIC CELLS FROM POST-LAYOUT PATTERNS

(75) Inventors: Purnabha Majumder, Sunnyvale, CA (US); Balakrishna Kumthekar, Santa Rosa, CA (US); Nimish Rameshbhai Shah, Cupertino, CA (US); John Mowchenko, Pleasanton, CA (US); Pramit Anikumar Chavda, Fremont, CA (US); Yoshihisa Kojima, Kawasaki (JP); Hiroaki Yoshida, Tokyo (JP); Vamsi Boppana, San Jose, CA (US)

(73) Assignee: Open-Silicon Inc., Milpitas, CA (US)

( * ) Notice: Subject to any disclaimer, the term of this patent is extended or adjusted under 35 U.S.C. 154(b) by 267 days.

(21) Appl. No.: 11/805,947

(22) Filed: May 25, 2007

(65) Prior Publication Data
US 2008/0127000 A1 May 29, 2008

Related U.S. Application Data

(60) Provisional application No. 60/809,132, filed on May 26, 2006.

(51) Int. Cl.
*G06F 17/50* (2006.01)
(52) U.S. Cl. .................................... 716/122
(58) Field of Classification Search .............. 716/2, 122
See application file for complete search history.

(56) References Cited

U.S. PATENT DOCUMENTS

| | | | |
|---|---|---|---|
| 5,764,533 A | 6/1998 | deDood | |
| 5,987,086 A * | 11/1999 | Raman et al. | 716/1 |
| 6,496,965 B1 | 12/2002 | van Ginneken et al. | |
| 6,543,039 B1 * | 4/2003 | Watanabe | 716/7 |
| 7,003,738 B2 * | 2/2006 | Bhattacharya et al. | 716/1 |

OTHER PUBLICATIONS

Bhattacharya, D. et al., "Automated Flex-Cell Based Design Beyond Standard-Cell Based Optimization and Synthesis," Zenasis Technologies Inc., Campbell, CA., pp. 1-29.

* cited by examiner

*Primary Examiner* — Jack Chiang
*Assistant Examiner* — Brandon W Bowers
(74) *Attorney, Agent, or Firm* — Ohlandt, Greeley, Ruggiero and Perle, L.L.P.

(57) ABSTRACT

A closed-loop IC design optimization process by automatically or manually creating design-specific cells with desired characteristics (e.g., performance, area, power, noise, etc.), which will be then implemented as a standard cell (also known hereafter as metacell), from a set of post-layout patterns. A post-layout pattern represents a part or whole of a standard cell and contains information regarding the pattern including, but not limited to, layout, timing, area, power and noise. As the metacells are created from post-layout patterns, the inaccuracies of prior dynamic library techniques are easily avoided. Such metacells, being design-specific, are optimized to satisfy the constraints imposed by the design context, thus bringing the powerful design-specific customization to standard cell-based design methodology.

12 Claims, 15 Drawing Sheets

(a)

Node Text: VDD VSS A Y
Layer Name: (nwell) (ndiff) (pdiff) (cont) (poly) (m1)

(b)

Node Text: VDD VSS A Y
Layer Name: (m1)

(c)

METHOD OF IC DESIGN OPTIMIZATION VIA CREATION OF DESIGN-SPECIFIC CELLS FROM POST-LAYOUT PATTERNS

CROSS-REFERENCED APPLICATIONS

This application claims priority to U.S. Provisional Patent Application No. 60/809,132, filed on May 26, 2006, which is incorporated herein in its entirety.

BACKGROUND

1. Field of the Disclosure

The present disclosure relates generally to a process and system of integrated circuit (IC) design optimization by automatically or manually creating design-specific cells with desired characteristics (such as, but not limited to performance, area, power, noise, etc.) that are implemented as standard cells from a set of post-layout patterns. A post-layout pattern represents a part or whole of a standard cell and contains information regarding the pattern including, but not limited to, layout, timing, area, power and noise.

2. Discussion of the Background Art

Incessant progress in IC manufacturing technologies is enabling the design of ever larger and complex circuits. The process of designing ICs can be broadly classified into two categories: custom and standard cell-based (see "Closing the Gap between ASIC & Custom," David Chinnery, Kurt Keutzer; Kluwer Academic Publishers, ISBN 1-4020-7113-2, 2002, which is incorporated herein by reference in its entirety (hereinafter referred to as Chinnery book). In custom design, ICs are constructed at the transistor-level. These transistors are customized specifically for that design, and are often designed manually. For this reason, custom design process is labor-intensive, time consuming and expensive. Standard cell-based design, on the other hand, constructs ICs utilizing a library of small, generic, and predefined, fixed, set of building blocks called standard cells. As such, resultant quality (area, speed, power, etc) of such designs is limited and inferior to that of custom-designed ICs. In addition, the fixed (static) set of standard cells in a library is not amenable to the customization of an IC.

FIG. 1 shows the typical design flow in the standard cell-based methodology. The flow goes through the steps of logic synthesis (105) and technology mapping (110) to produce a design netlist (mapped to the standard cells existing in the fixed library (100)) from RTL. The mapped design netlist is then placed and routed to produce the final layout. Physical-aware logic optimization (115) is also performed to take advantage of accurate placement and routing information, thus resulting in faster convergence to design goals. The logic synthesis (optimization) and place-and-route steps are often necessary to be repeated (in an iterative fashion) until the desired characteristics of the design are achieved. In the entire design process the contents of the library (100) remain unchanged, which often leads to designs with inferior quality and contribute to longer design cycle.

Prior approaches at bridging the gap between custom designs and standard cell-based designs, can be broadly categorized under two groups—fixed library techniques (that do not change the standard cells in the library) and dynamic library techniques (that change the standard cells in the library).

Several fixed-library techniques have been proposed earlier (see Chinnery book, ICCD'1997, Page 110-115, "Discrete Drive Selection for Continuous Sizing," R. Haddad, Van Ginneken Lukas P. P. P., N. Shenoy and U.S. Pat. No. 6,496,965, "Automated design of parallel drive standard cells," Van Ginneken Lukas P. P. P., Nijssen; Raymond X. T., Buch; Premal., which are incorporated herein by reference in their entirety). These techniques typically rely on design-level analysis, optimization and abstraction. Techniques in this group include micro-architecture tuning (enabling more customized RTL design implementation, see Chapter: Improving Performance through Microarchitecture in Chinnery book), customized placement and floor-planning (enabling more customized physical design implementation, see Chapter: Physical Prototyping Plans for High Performance in Chinnery book) clock-skew techniques (enabling more customized clock-tree implementation, see Chapter: Useful-Skew Clock Synthesis Boosts ASIC Performance in Chinnery book), controlling process margins (enabling lesser loss in process variations, see Chapter: Controlling Uncertainty in High Frequency Designs), which are incorporated herein by reference in their entirety), parallel-drivers (enabling more customized use of drivers cells, see references: ICCD'1997, Page 110-115, "Discrete Drive Selection for Continuous Sizing," R. Haddad, Van Ginneken Lukas P. P. P., N. Shenoy and U.S. Pat. No. 6,496,965, "Automated design of parallel drive standard cells," Van Ginneken Lukas P. P. P., Nijssen; Raymond X. T., Buch; Premal), etc. Prior techniques using dynamic libraries create on-the-fly, design-specific, optimized transistor-level functional blocks directly from the functional specification. The functional specification of the netlist is represented as a Binary Decision Diagram (BDD), Zero-suppressed Decision Diagram (ZDD), other variants of decision diagrams, factored-form Boolean expression, etc. These abstract representations form the basis for creating context-specific standard cells (see U.S. Pat. No. 7,003,738, "Process for automated generation of design-specific complex functional blocks to improve quality of synthesized digital integrated circuits in CMOS using altering process," Bhattacharya; Debashis, Boppana; Vamsi, Murgai; Rajeev, Roy; Rabindra, and "Transistor-Level Optimization of Digital Designs with Flex Cells," Rob Roy; Debashis Bhattacharya; Vamsi Boppana; IEEE Computer; February 2005 (Vol. 38, No. 2) pp. 53-61, which are incorporated herein by reference in their entirety)), as shown in FIG. 2. In this method, an abstract representation of the functional specification of a sub-section of design is mapped (210) to an interconnection of transistors, or transistor network. These mapping methods rely on metrics such as, number of transistors, stack depth, number of nets, number of terminals connected to nets, etc., to estimate layout characteristics such as transistor folds, diffusion area, wiring, parasitics, etc. The electrical and physical characteristics of the design-specific cell are then calculated based on these estimated parameters (215). In deep submicron processes, these metrics, however, are often incapable of accurately predicting the layout characteristics that strongly determine the final quality (e.g., performance, area, power, noise, etc.) of the design-specific cell. As a result, characterization (225) of the cell based on estimated layout parameters may be inaccurate. In a nutshell, the limitation of this method lies in the fact that any decisions made prior to complete cell layout (230) may result in unnecessary transistor-level optimization iterations before the cell is accepted for use in the standard cell-based flow.

Cell layout synthesis (230) is a computationally intensive task and it may often be impractical to embed that process in the creation of on-the-fly design-specific standard cells. On the other hand, without fully realizing and implementing the design-specific custom cells it is not possible to precisely converge on a design goal. This difficulty coupled with the reliance on estimated layout characteristics results in an open-loop methodology (shown by dotted lines in FIG. 2) that is incapable of addressing the creation of design-specific standard cells in advanced deep sub-micron processes.

In contrast, the present disclosure discloses a closed-loop dynamic library transformation.

Inaccuracies that are typically associated with design-level abstraction and analysis are addressed in the method of the present disclosure by the standard cell encapsulation of the created metacell. Key advantages of the present disclosure include, but are not limited to:

- The automatic scheme of the present disclosure can create arbitrary structures from the cache patterns.
- Accurate circuit simulation (rather than static timing analysis) is employed to characterize metacells.
- The constituent cache patterns of a metacell are an integral part of the metacell (and hence are immune to disruptive influences of design-level placement and routing) and hence afford greater control during design optimization.
- After characterization and view generation metacells are used as standard cells in design optimization.

In contrast to "layout" related work described in the literature (see U.S. Pat. No. 5,764,533, "Apparatus and methods for generating cell layouts," deDood; Paul C., which is incorporated herein by reference in its entirety), which primarily focuses on creation of standard cell layout from scratch, the method of the present disclosure creates and/or reuses existing layout patterns to create new layouts in order to meet various design constraints.

The present disclosure also provides many additional advantages, which shall become apparent as described below.

SUMMARY

The present disclosure describes a closed-loop process of IC design optimization via automatic or manual creation of design-specific cells with desired characteristics (such as, but not limited to, performance, area, power, noise, etc.), which will be implemented as a standard cell (also known hereafter as "metacell") from a set of post-layout patterns. A post-layout pattern represents a part or whole of a standard cell and contains information regarding the pattern including, but not limited to, layout, timing, area, power and noise.

Such metacells, being design-specific, are optimized to satisfy design objectives (i.e., goals) under the constraints imposed by the design context, thus bringing the powerful design-specific customization to standard cell-based design methodology. The present disclosure includes the following embodiments from automation point of view.

In one embodiment, an automatic scheme present in our disclosure can create arbitrarily complex metacells by transforming the underlying post-layout patterns.

In another embodiment, a manual scheme present in our disclosure can create arbitrarily complex metacells by transforming the underlying post-layout patterns. The manual scheme is guided by any end-user or entity to leverage any specific knowledge or limitation of the IC design flow.

The present disclosure includes the following embodiments from usage of post-layout patterns point of view.

In one embodiment, the present disclosure creates a set of post-layout patterns (also known as cache patterns), which are subsequently used by a closed-loop mapping process. Cache patterns can be used either stand-alone or in conjunction with patterns existing in the standard cell library.

In another embodiment, the present disclosure creates design-context specific metacells by using layout patterns from an existing standard cell library. Those familiar with the art can readily observe that the standard cell library is also a set of post-layout patterns, where individual standard cells are post-layout building blocks. A pattern transformation technique is employed to use part of the whole of a standard cell to populate in the cache of layout patterns.

Only limited layout modifications (for example, metal wires to realize the interconnect, contact changes, poly changes, diffusion changes, etc.) are then necessary to implement the metacell layout. Leveraging the complete and accurate post-layout information of the constituent layout patterns results in accurate parasitic extraction for the metacell. Relevant views (for example, placement view, routing view, timing view, etc.) necessary to fit in the standard cell-based design methodology are generated to complete the standard cell encapsulation of the metacell.

The metacell (now indistinguishable from a standard cell) can be instantiated in the design to improve a plurality of design objectives such as, but not limited to, performance, area, power, noise, manufacturability, etc as well as a host of user-level customization directives such as, but not limited to, achieve tighter physical binding among a group of cells, nullify inaccuracy of certain design metrics and views, reuse certain functionality (as a standard cell) inter and intra-designs, etc.

Additional benefits of current disclosure include the following: analysis based cache generation framework can create an augmented standard cell library, having better quality of metric compared to input standard cell library. Augmented standard cell library can be used by any synthesis, physical synthesis or mapping technique to produce better quality of result for an IC design.

The present disclosure relates to an IC design optimization process that includes cache creation, design optimization, custom metacell creation, and view completion that ensures design and library input/output consistency.

Importantly, the present disclosure involves the unique use of cell fragments or portions of standard cells in the post-layout patterns to form unique new standard or augmented cell. Preferably, these fragments come from either or both of two sources: 1) original creations that have no connection to the augmented cell library, and 2) "cutting out" chunks of the layouts from the cells in the augmented library.

Further objects, features and advantages of the present disclosure will be understood by reference to the following drawings and detailed description.

DETAILED DESCRIPTION OF THE PREFERRED EMBODIMENT

Figure 1:
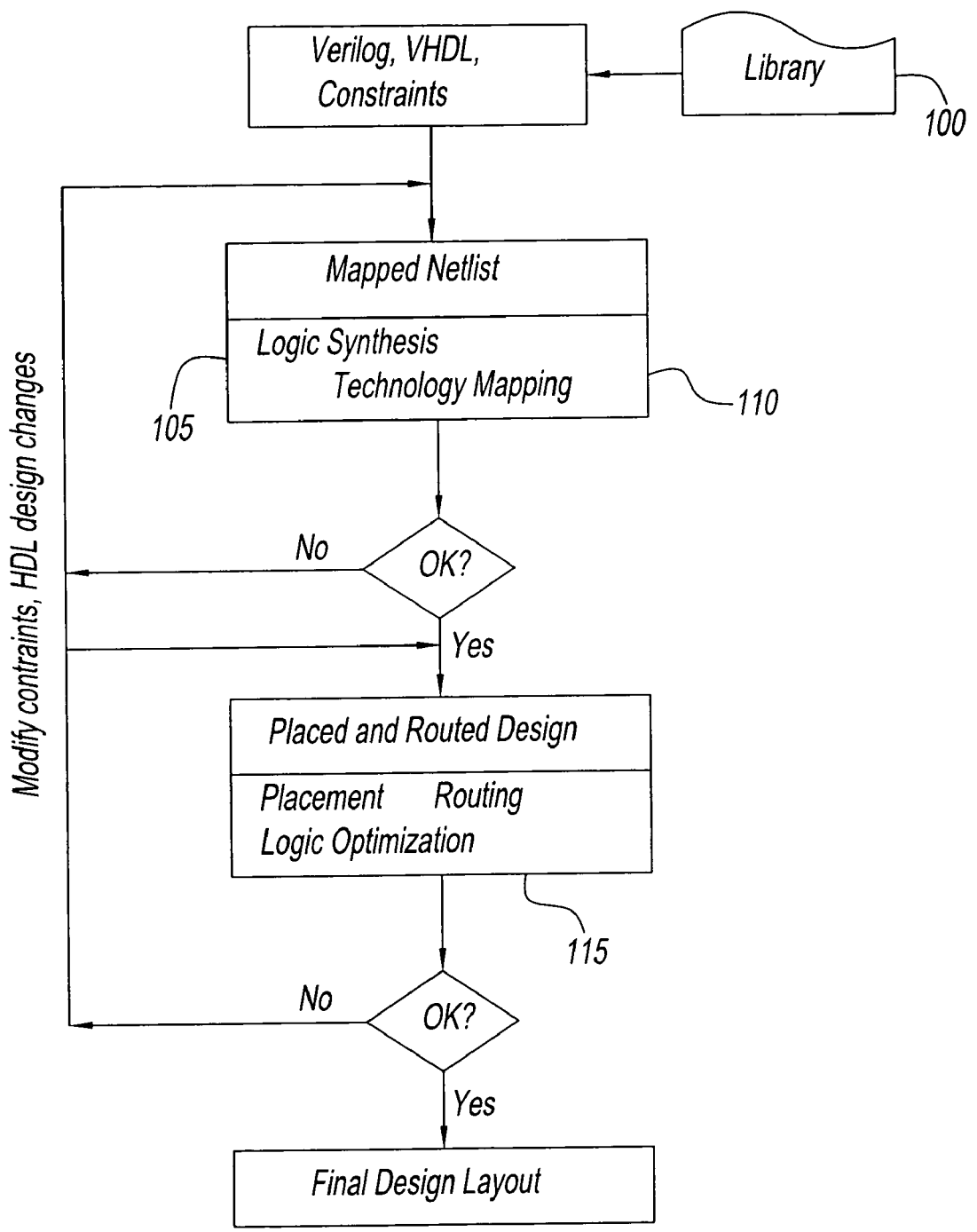
FIG. 1 is a flow diagram depicting a conventional standard cell-based design flow.
Figure 2:
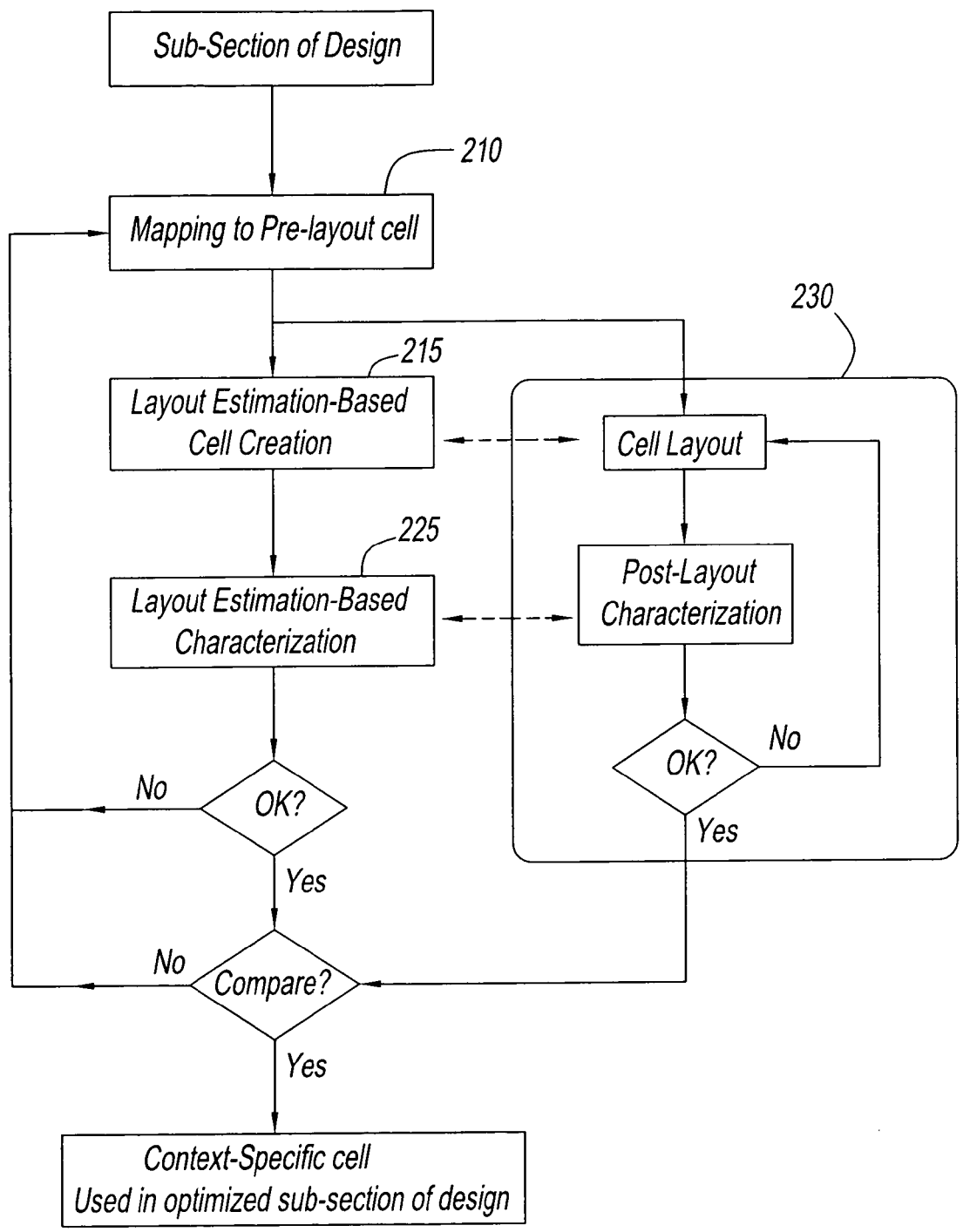
FIG. 2 is a flow diagram depicting a conventional process scheme (i.e., open-loop dynamic-library) for the creation of on-the-fly design-specific cells.

A method for optimizing an integrated circuit design comprising: creating a cache of post-layout patterns; and optimizing the integrated circuit design using the cache of post-layout patterns to create design-specific and/or context-specific standard cells. The cache of post-layout patterns is created by the method comprising: analyzing a standard cell library for the distribution of cell characteristics over the various cells in each logic family and/or analyzing the standard cell library to determine the layout architectures of the cells; optionally, enhancing the standard cell library by adding new cells, wherein the new cells are based on the results of the analysis of cell characteristics and layout architectures, thereby combining the new cells with the standard cell library to create an augmented cell library; creating standard cell fragments, where the standard cell fragments are integrated circuit layouts that can be combined to construct a new standard cell, in whole or in part; breaking some or all of the standard cells from the augmented cell library into the augmented cell fragments, and selecting some or all of the augmented cell fragments; and creating the cache of post-layout patterns that is comprised of at least one cell selected from the group consisting of: cells from the augmented cell library, the standard cell fragments, and the augmented cell fragments.

The characteristics are selected from the group consisting of: signal timing, input capacitance, power, noise, area and combinations thereof. The layout architecture is at least one selected from the group consisting of: transistor orientation, number of transistor fingers, via and contact positioning and interconnection layers used.

The enhancing creates the new cells that have characteristic values that are not sufficiently represented in the standard cell library. The enhancing the layout of the new cells is based on the layout architectures used in the standard cell library. The step of enhancing creates, for the new standard cells, some or all of the representations that are required of the standard cell in the standard cell library, wherein the representations are at least one selected from the group consisting of: net list, signal timing, input capacitances, power, noise, area, layout geometry, and layout parasitics.

The step of creating produces some or all of the representations required of the new standard cell in the standard cell library, wherein the representations are at least one selected from the group consisting of: net list, signal timing, input capacitances, power, noise, area, layout geometry, and layout parasitics.

The step of optimizing the integrated circuit design comprises: selecting a connected, multi-input, multi-output subset of the standard cells from the network, thereby creating a sub-network; defining constraints to be imposed on the sub-network from the network, and from the sub-network's local context within the network; creating one or more implementations of the sub-network using post-layout patterns from the cache of post-layout patterns; building a design-specific and/or context-specific standard cell for each implementation determined in the previous step; substituting a newly built design-specific and/or context-specific standard cell for the sub-network, thereby forming a modified network; and evaluating the characteristics of the modified network with the design-specific and/or context-specific standard cell, and determining whether to accept or reject the design-specific and/or context-specific standard cell substitution.

The step of selecting uses at least one selection criteria selected from the group consisting of: the physical proximity of standard cells in the network, signal timing, timing criticality, power, area and noise.

The constraints imposed on the sub-network are at least one selected from the group consisting of: signal timing, input capacitance, area, noise and power.

The step of defining derives constraints from cell model characteristics of instances in the network, and from characteristics of the network as a whole, wherein the characteristics are selected from the group consisting of: signal timing, drive strength, physical location, area, power, noise and combinations thereof. The step of defining derives constraints from standard cell model characteristics selected from the group consisting of: permissible number of fan outs, permissible transition times, delay, power, area, noise, and combinations thereof.

The step of creating comprising: creating one or more sets of post-layout patterns, where the patterns are taken from the post-layout cache, and where the patterns in each of the sets can be interconnected to produce the same function as the sub-network; and selecting one or more of the sets of post-layout patterns that satisfy some, or all, of the constraints placed on the sub-network.

The step of selecting uses at least one process selected from the group consisting of: placing the set of post-layout patterns, routing the interconnections between the post-layout patterns, polygon merging, polygon fracturing, extracting the circuit, extracting layout parasitics and simulating the interconnected post-layout patterns.

The step of selecting is based on at least one characteristic of the set of interconnected post-layout patterns selected from the group consisting of: signal timing, input capacitance, area, power and noise. The characteristics are either estimated or evaluated accurately.

The step of building produces some or all of the representations required of a standard cell in the standard cell library, wherein the representations are at least one selected from the group consisting of: net list, signal timing, input capacitance, power, noise, area, layout geometry, and layout parasitics. The representations are as accurate as those in the standard cell library.

The step of evaluating uses at least one characteristic of the design selected from the group consisting of: signal timing, power, area and noise.

FIGS. 1-16 may cite specific examples, such as, certain logic families (e.g., static CMOS, NMOS, pMOS, etc.), certain sub-section of design netlist (e.g., combinational, etc.), certain cell topologies (e.g., NOR), certain design context, certain layout representation (e.g., with or without tap/bulk connection, 2-well process, usage of 1 poly and 1 metal (for intra-pattern routing, single height patterns, metal 2 or metal 3 usage for intra-cell routing), etc.; but it should be noted that this specialization (if any) is only for the purpose of illustrating the method and system of current disclosure and should not diminish in any way the generalization of the disclosure as described and claimed elsewhere in this document.

A process of IC design optimization by automatically or manually creating design-specific cells with desired characteristics (such as, but not limited to, performance, area, power, noise, etc.), which are then implemented as standard cells (also known hereafter as metacell) from a set of post-layout patterns. A post-layout pattern represents a part or whole of a standard cell and contains information regarding the pattern including, but not limited to, layout, timing, area, power and noise. As the metacells are created from pre-characterized post-layout patterns, the inaccuracies of prior methods (i.e., fixed-library, open-loop dynamic-library, etc.) are easily avoided (FIG. 3), as explained in the subsequent paragraphs. The input to the process of the present disclosure is a sub-section (henceforth also called "cluster") of a network of connected standard cells (henceforth also called as "netlist") of the IC design, along with design constraints (viz., delay, power, area, etc.), technology process parameters, etc. and the output is a metacell with accurate and complete set of views substituting the input cluster in the netlist and meeting the target design constraints. The present disclosure brings in a unique technique that can accurately inherit the characteristics and views of post-layout patterns, and transform them into a new standard cell, thereby making the whole process closed-loop.

Inaccuracies that are typically associated with design-level abstraction and analysis are addressed in the method of the present disclosure by the standard cell encapsulation of the created metacell. Key advantages of the present disclosure include, but are not limited to:

The automatic scheme of the present disclosure can create arbitrary structures from the cache patterns.

Accurate circuit simulation (rather than static timing analysis) is employed to characterize metacells.

The constituent cache patterns of a metacell are an integral part of the metacell (and hence are immune to disruptive influences of design-level placement and routing) and hence afford greater control during design optimization.

After characterization and view generation metacells are used as standard cells in design optimization.

Additionally, in contrast with previous dynamic library techniques, convergence and accuracy issues of open-loop approaches are dealt with by the unique mapping technique to create a metacell from a set of post-layout patterns. A proprietary mapping technology is used for this purpose, and the metacells created by the process of the present disclosure are design-specific and are optimized to satisfy the constraints imposed by the design context. This enables powerful, accurate and closed-loop, design-specific customization to standard cell-based design methodology as disclosed in copending and commonly owned U.S. patent application Ser. No. 09/896,059, filed on Jun. 29, 2001, which is incorporated by reference in its entirety.

Figure 3:
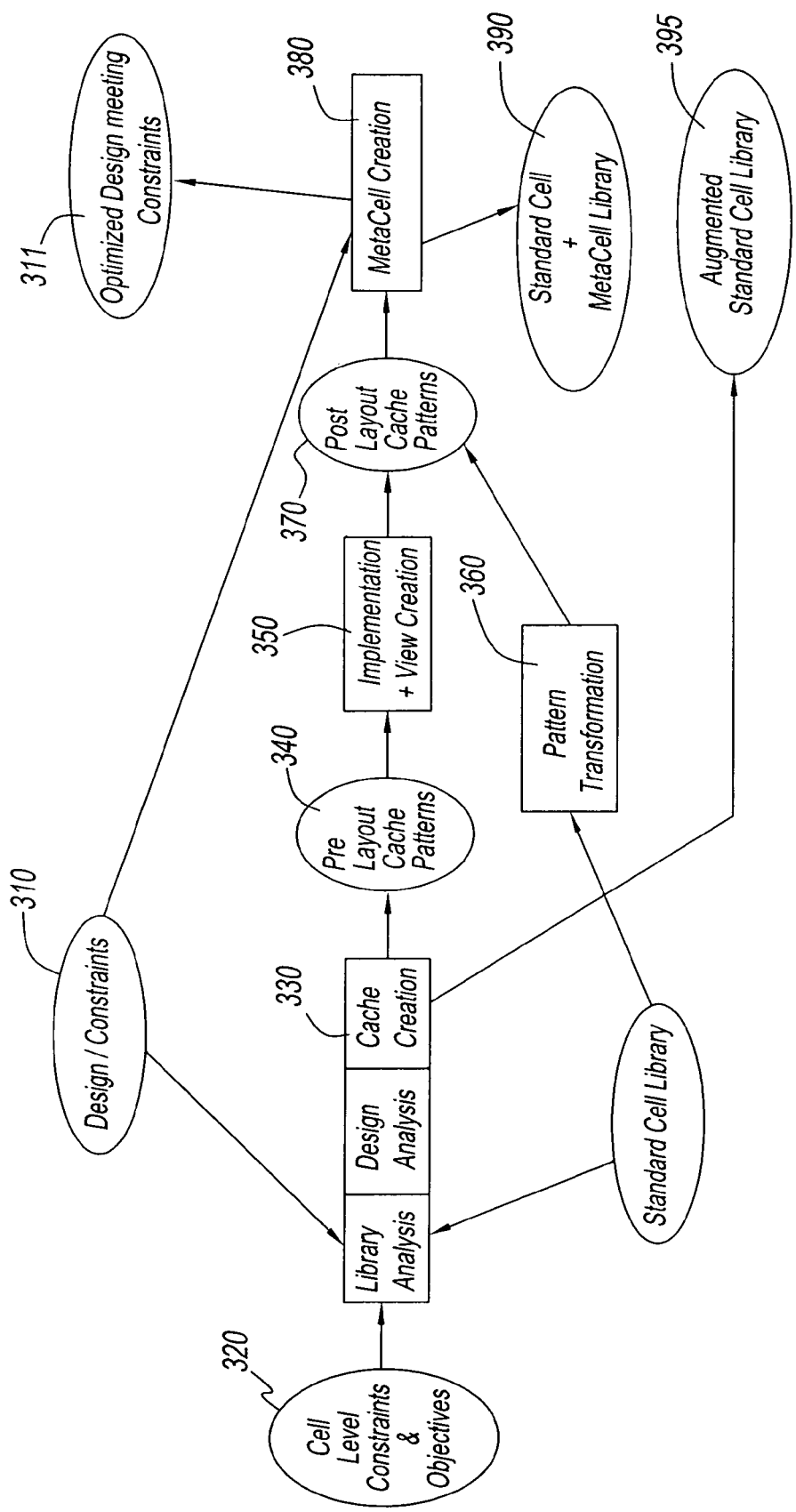
FIG. 3 is a block diagram depicting integrated flow of cache creation and using the created cache for design-specific metacell creation according to the present disclosure.

In another embodiment, the present disclosure discloses a technique that can produce the necessary and required post-layout patterns to create a metacell. A complete set of characteristics and views of the layout patterns are created and populated in a cache of post-layout patterns (also called cache patterns hereafter). FIG. 3 describes the entire process of cache pattern creation and using the same for design-specific metacell creation in an integrated view. In addition, information related to cache pattern creation process is built-into the system in order to aid proprietary mapping/sizing techniques to take full advantage of the cache.

Figure 5:
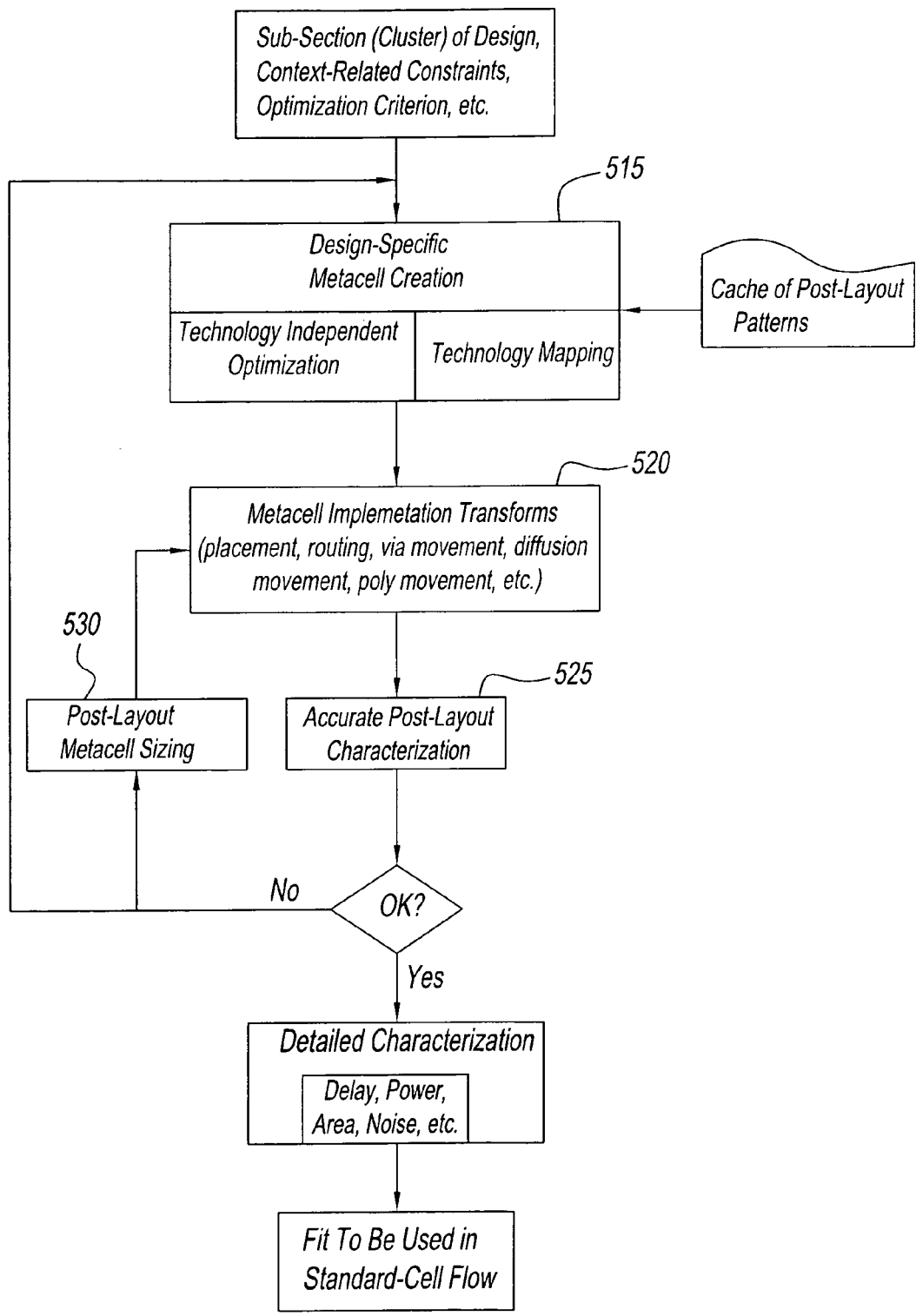
FIG. 5 is a flow diagram depicting the process for creating metacells according to the present disclosure.
Figure 6:
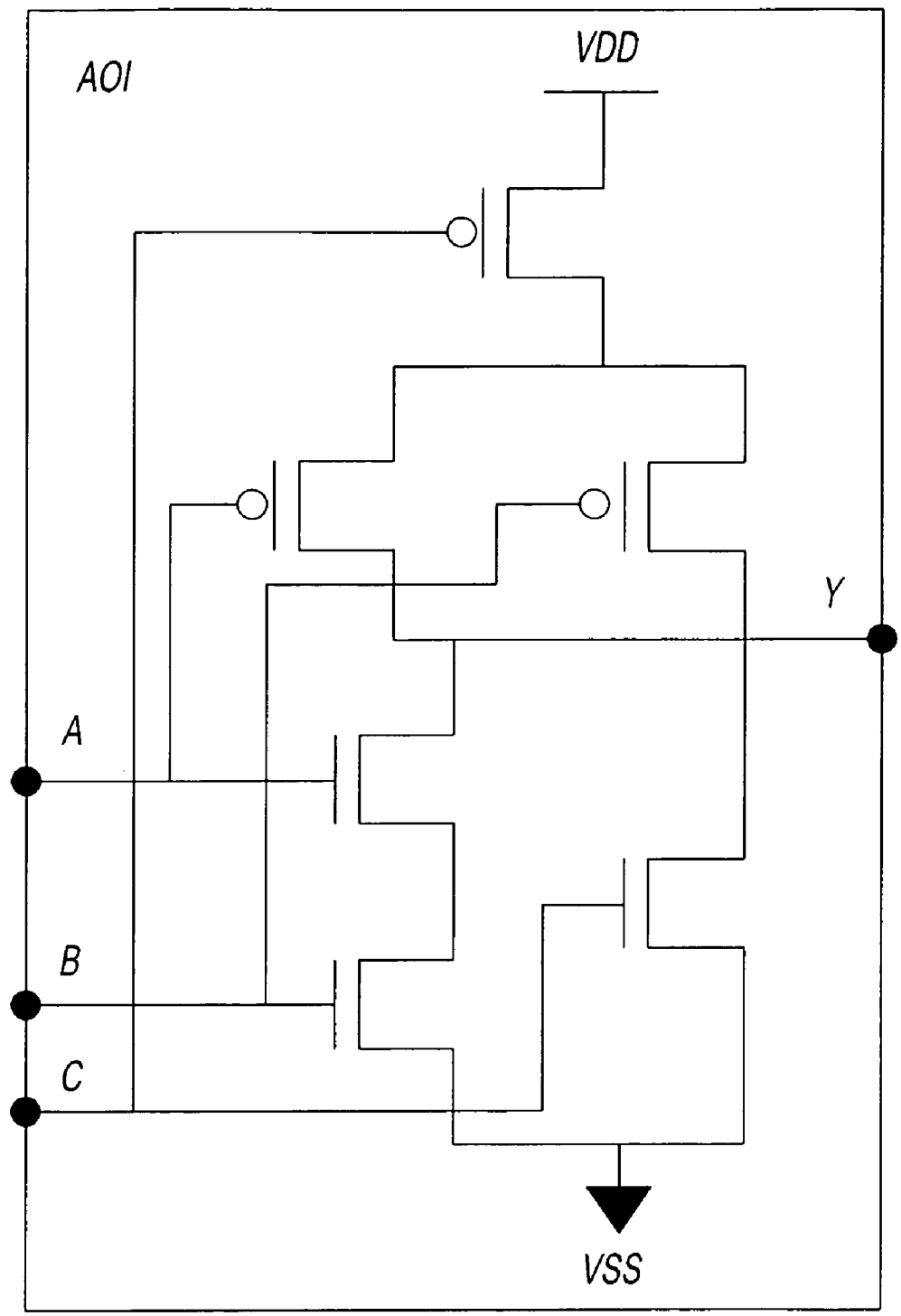
FIG. 6 is a schematic representation of a circuit realizing a complex Boolean function.

FIG. 3 shows the input/output interfaces along with top-level control boxes of the current disclosure in an integrated way. A cache of post-layout patterns (370) with all the necessary views are created in the following two steps: (a) a pattern transformation technique (360) that uses existing standard cell library, and (b) a pattern creation technique (330) that creates pre-layout pattern (340) from extensive analysis of technology, library, cell-level constraints (320), design data (310), etc. and subsequently implemented (350) in layout. Metacell creation flow (380) works with either (a) or (b) or with (a) and (b) in conjunction to create design specific metacells which are encapsulated in the form of standard cells (390), thereby optimizes the design (311). FIG. 5 shows the steps involved in creating design-specific metacells, i.e., mapping to metacell (515), implementation transform (520), physical verification/extraction, characterization (525), and metacell sizing (530).

Figure 4:
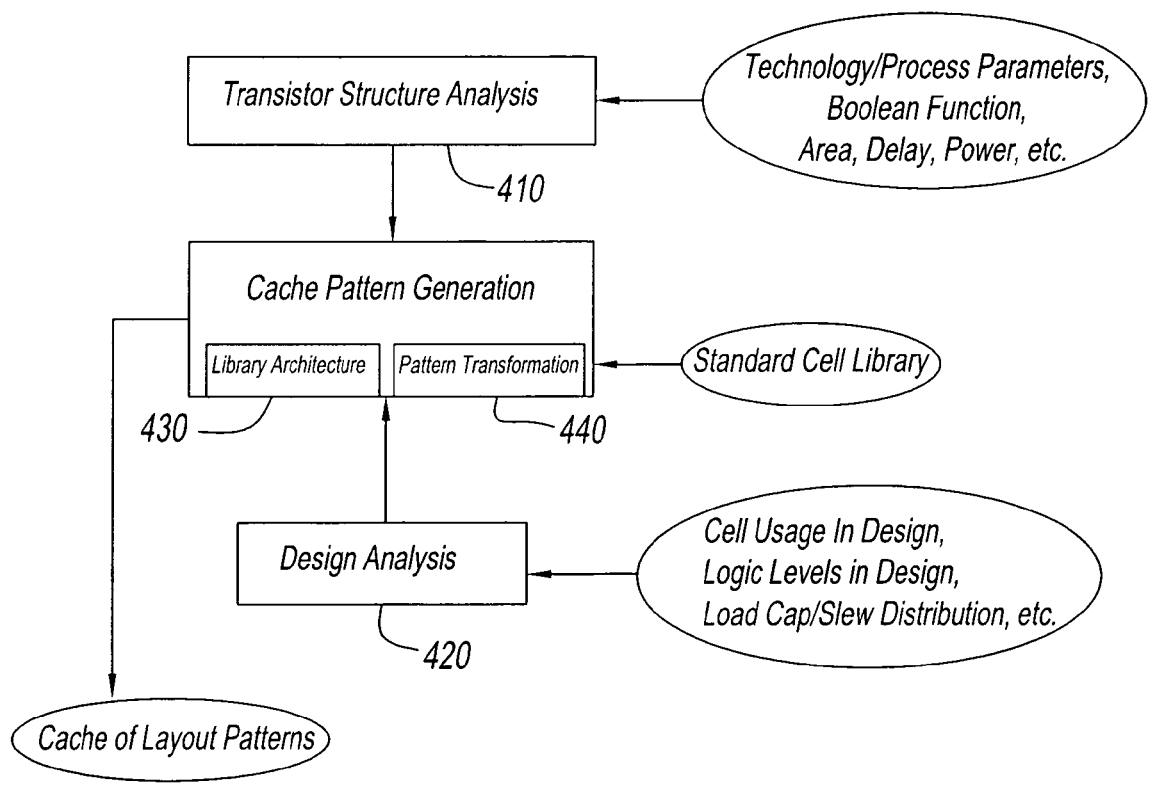
FIG. 4 is a flow diagram depicting the process of creating cache patterns according to the present disclosure.

The process of the present disclosure comprises of the following steps:

1. Creation of a set of post-layout patterns with a variety of transistor topologies targeting design quality parameters such as, but not limited to, performance, area, power, reliability, manufacturability, etc. FIG. 4 shows the process of creation of cache patterns. The cache patterns are created after extensive analysis of various transistor networks and topologies, underlying process technology parameters (410), characteristics of the design being optimized (420), the layout patterns (440) that exist in target standard cell library vis-à-vis cell layout architectural features (430) such as, but not limited to, heights, active area, power and ground connections, metals, contacts, etc. Quality of proprietary mapping and sizing techniques (described in subsequent steps) depend on certain regularity of fabric of created cache patterns. As a result, created patterns along with necessary information of creation process are captured into the cache, which is then effectively used by proprietary mapping/sizing to produce improved quality of results.

Examples of cache patterns are:
   i. All circuit types, such as, but not limited to static CMOS, PTL, ratioed, dynamic CMOS, domino, etc.
   ii. All functional types (combinational, sequential, dynamic, etc.) up to a certain number of inputs, m, where m can be any number (FIG. 6.)
   iii. For a given cache pattern type, a set of k-functional stage implementations, e.g., single-stage, two-stage, etc.
   iv. For a given cache pattern type multiple variations of transistor sizes.
   v. For a given cache pattern type multiple variations of the ratio of pull-up and pull-down transistor sizes.
   vi. For a given cache pattern type multiple variations of transistor threshold voltage (Vt) fixed per cell (single-Vt cell), and mixed-Vt cells.

vii. Variations of layout implementation of cache patterns, such as, but not limited to, multiple height (single height, double height, etc.), metals, contacts, etc.
viii. Layout structures that consist of only fingers of transistors.
ix. Transistor structures with special characteristics such as balanced input-output delays, low power consumption (with sleep transistors), etc.
x. Regular transistor structure fabrics that guarantee manufacturability and improve yield prediction.

Schematic, layout, layout-abstract, etc. views of a few cache patterns are shown in FIGS. 10(a)-11(d).

Additional benefits of cache creation include the following: analysis based cache generation framework can create an augmented standard cell library (395), having better quality of metric compared to input standard cell library.

An augmented standard cell library can be used by any synthesis, physical synthesis or mapping technique to produce better quality of result for an IC design.

Figure 7:
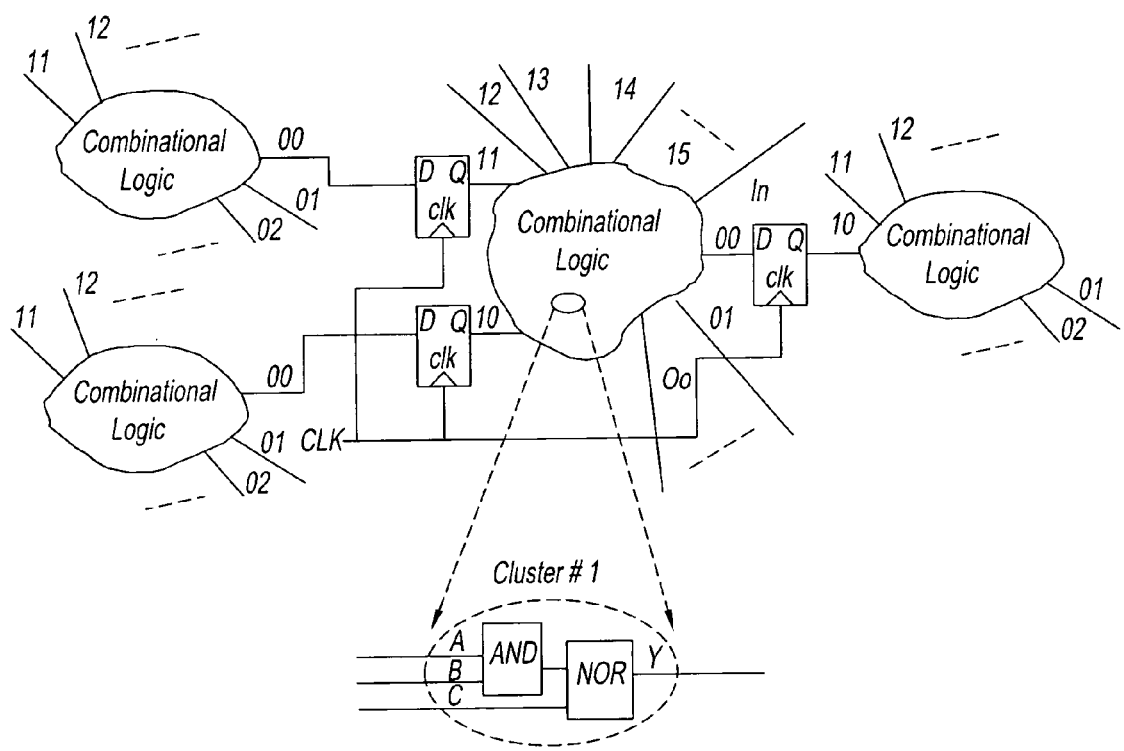
FIG. 7 is a schematic representation of a system having a design netlist and formation of cluster according to the present disclosure.
Figure 8:
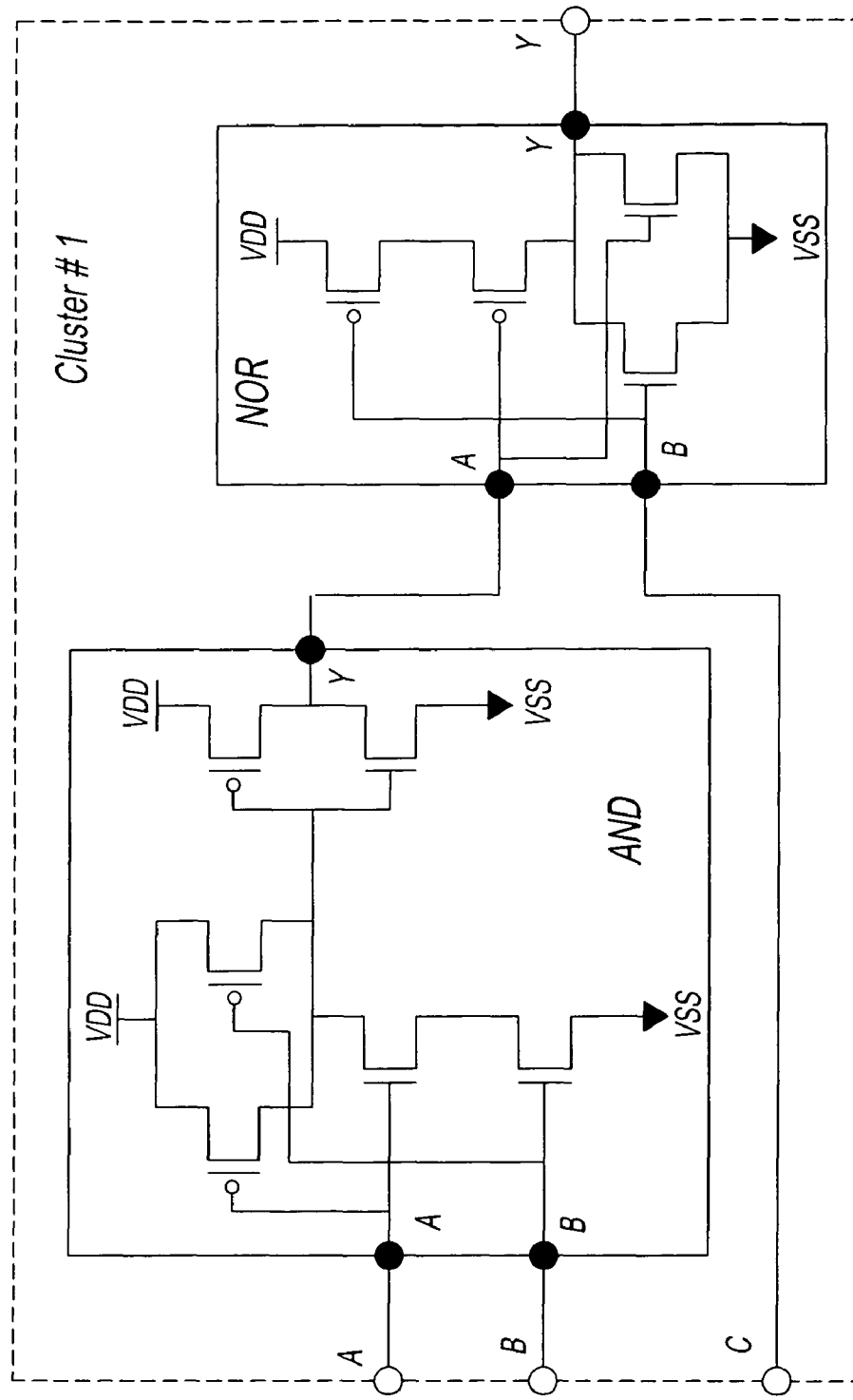
FIG. 8 shows the cluster (in dotted bounding-box) realizing a Boolean function, with certain design contexts, and certain optimization objectives to meet.

2. Receiving as input a multi-input and multi-output subsection (FIG. 8) of design netlist (FIG. 7) with design-specific constraints such as performance, area, power, etc. FIG. 7 shows typical section of an IC design netlist having sequential and combinational logic elements. Sequential elements such as, flip-flops, latches, etc. are separated by combinational clouds with multiple inputs and outputs, which include various combinational elements, such as NOR, AND, etc. In order to meet the target optimization objectives and depending on the mode of operation various rules, such as, but not limited to, setup time, hold time, timing design rules, recovery time, removal time, leakage power, switching power, etc. need to be obeyed by this section of the netlist, which in turn decides the criticality or non-criticality of this section. Based on the optimization objective and criticality/non-criticality of this section of the netlist, a multi-input/multi-output sub-section of the netlist (also called cluster) is identified along with necessary constraints in order to create a design-specific metacell. FIG. 8 shows a cluster (cluster #1) for illustration; this cluster includes a 2-input AND and a 2-input NOR combinational logic.

Figure 9:
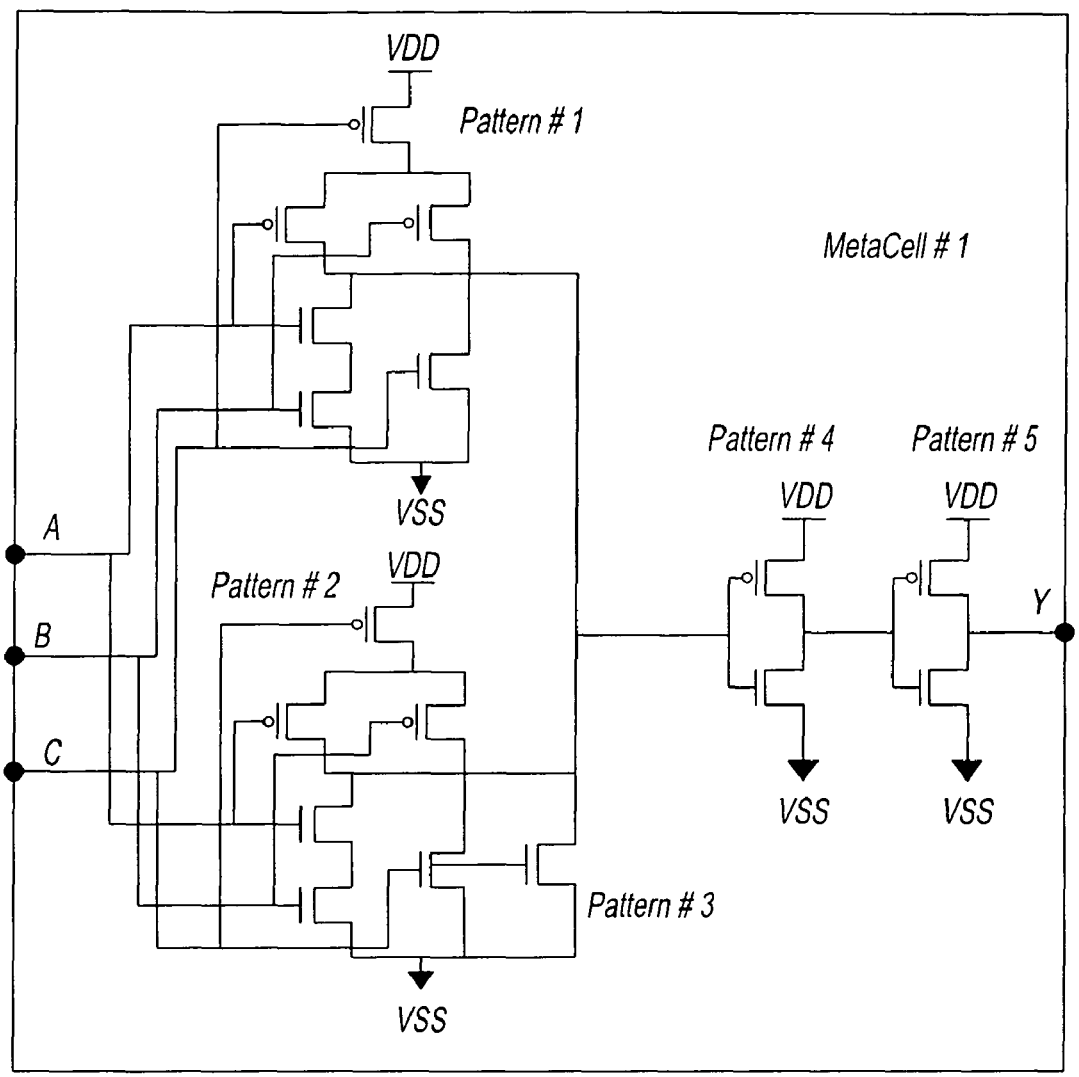
FIG. 9 shows the mapped metacell realizing target Boolean function and meeting the required optimization objectives, as well as depicting the uniqueness of the mapping technology in terms of using an nMOS finger layout pattern.
Figure 10:
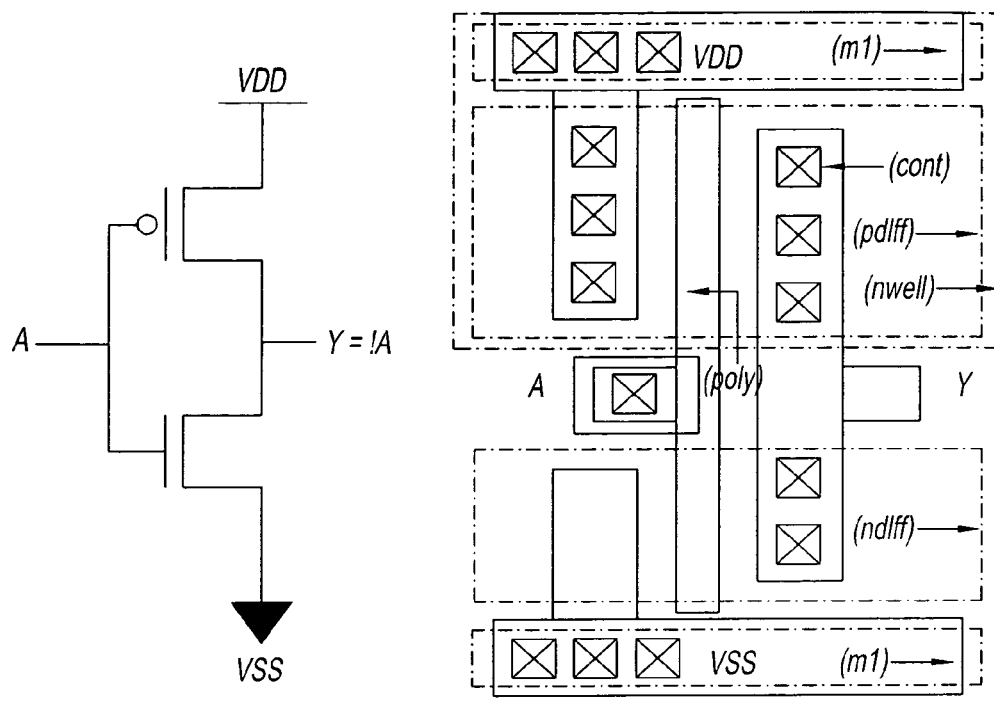
FIG. 10 shows the schematic (10a), layout (10b) and layout-abstract (10c) representations of a cache pattern created in the present disclosure and used for implementation transform of the metacell created in FIG. 9.
Figure 10:
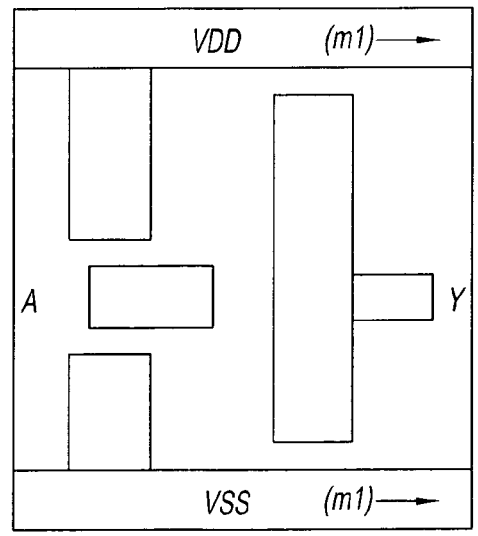
Figure 11:
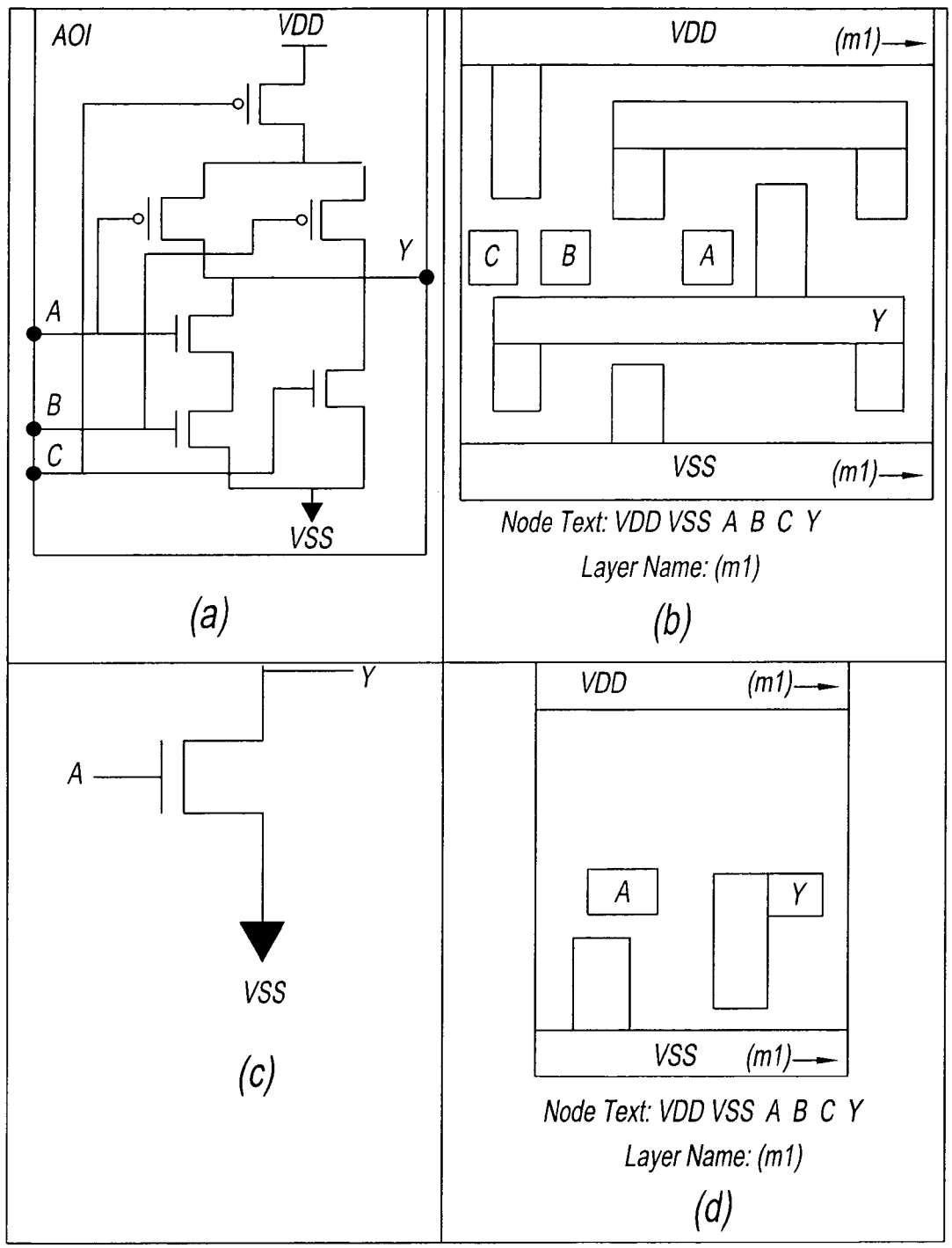
FIG. 11 shows the schematic and layout-abstract of a few cache pattern that are used for implementation transform of the metacell created in FIG. 9. Illustrated are the schematic (11a) and layout abstract (11b) of a NOR cache pattern as well as schematic (11c) and layout abstract (11d) of a layout only pattern (NMOS finger layout pattern).
Figure 12:
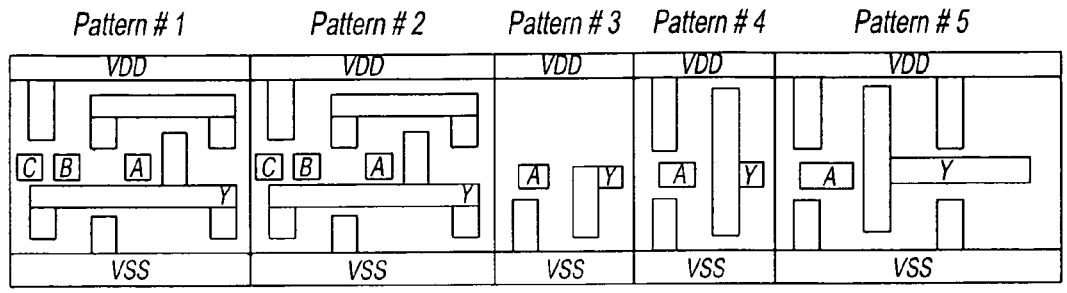
FIG. 12 shows single height placement view representation of the metacell created in FIG. 9 by using layout-abstracts shown in FIG. 10-11 as layout patterns 1-5.
Figure 13:
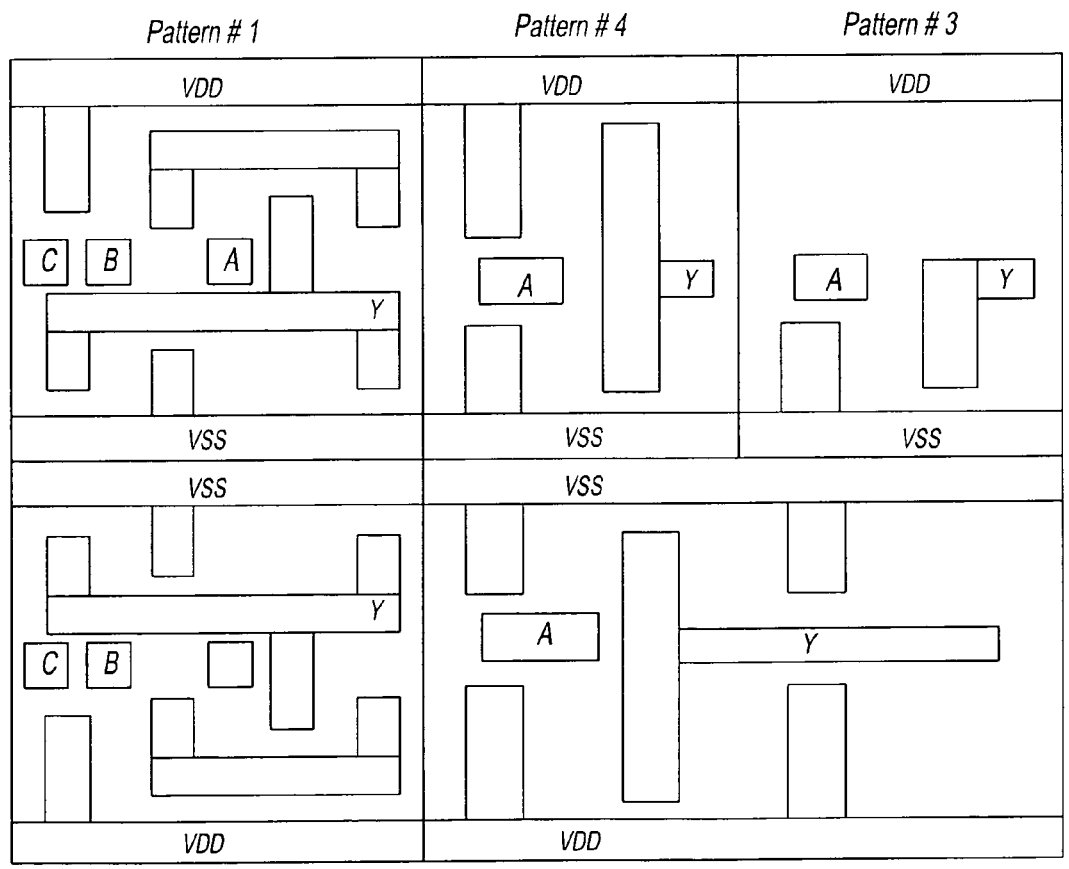
FIG. 13 shows double height placement view representation of the metacell created in FIG. 9 by using layout-abstracts shown in FIG. 10-11 as layout patterns 1-5.
Figure 14:
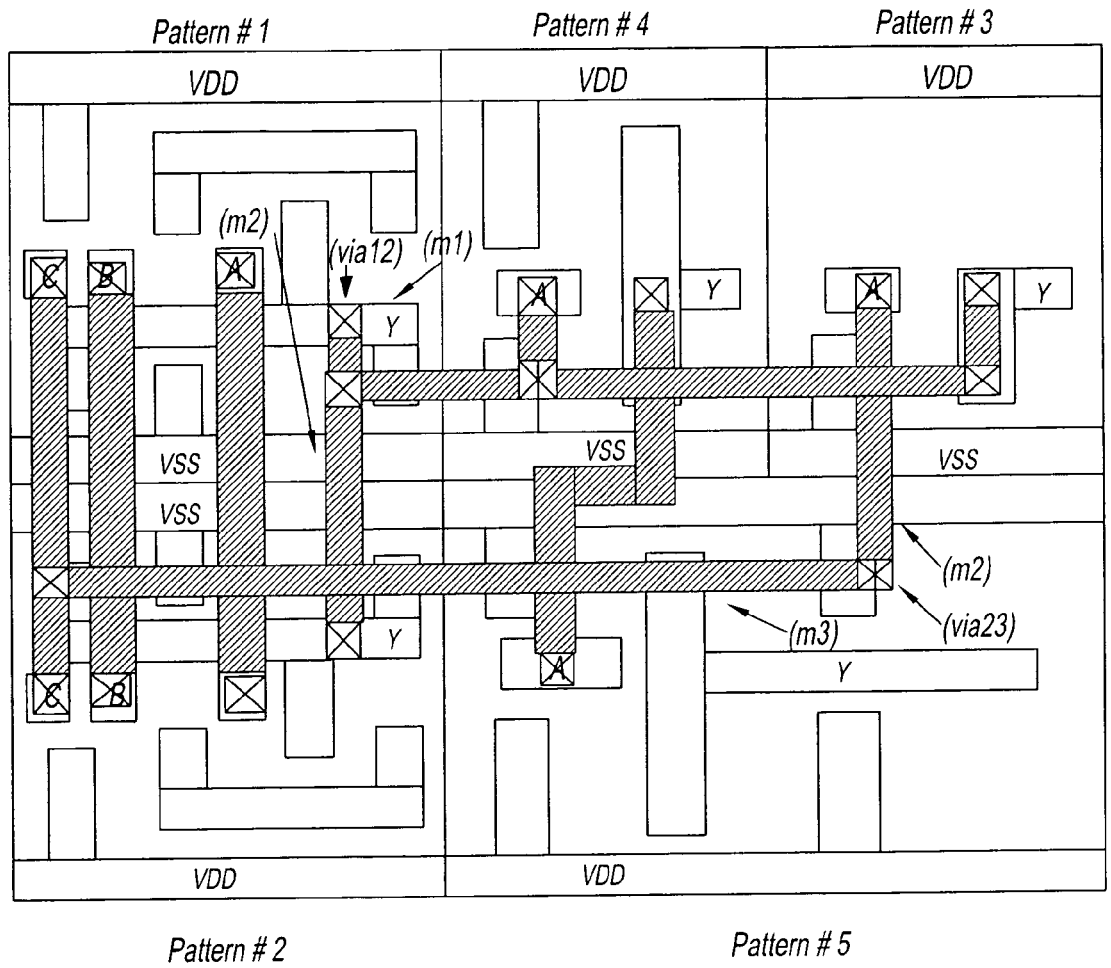
FIG. 14 shows finished metacell with complete set of transforms e.g., placement, routing, etc. for double height representation of the metacell for patterns 1-5.
Figure 15:
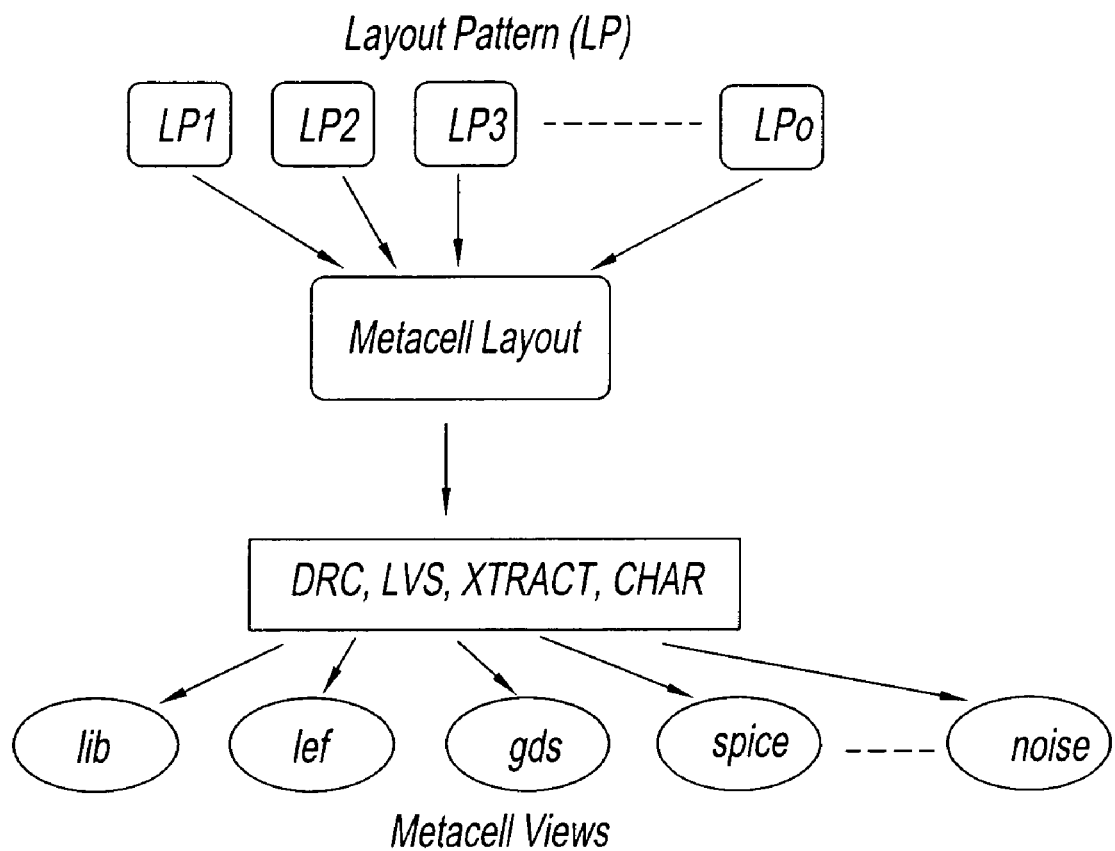
FIG. 15 is a block diagram which depicts the steps in creation of metacell views to fit into standard cell based flow.
Figure 16:
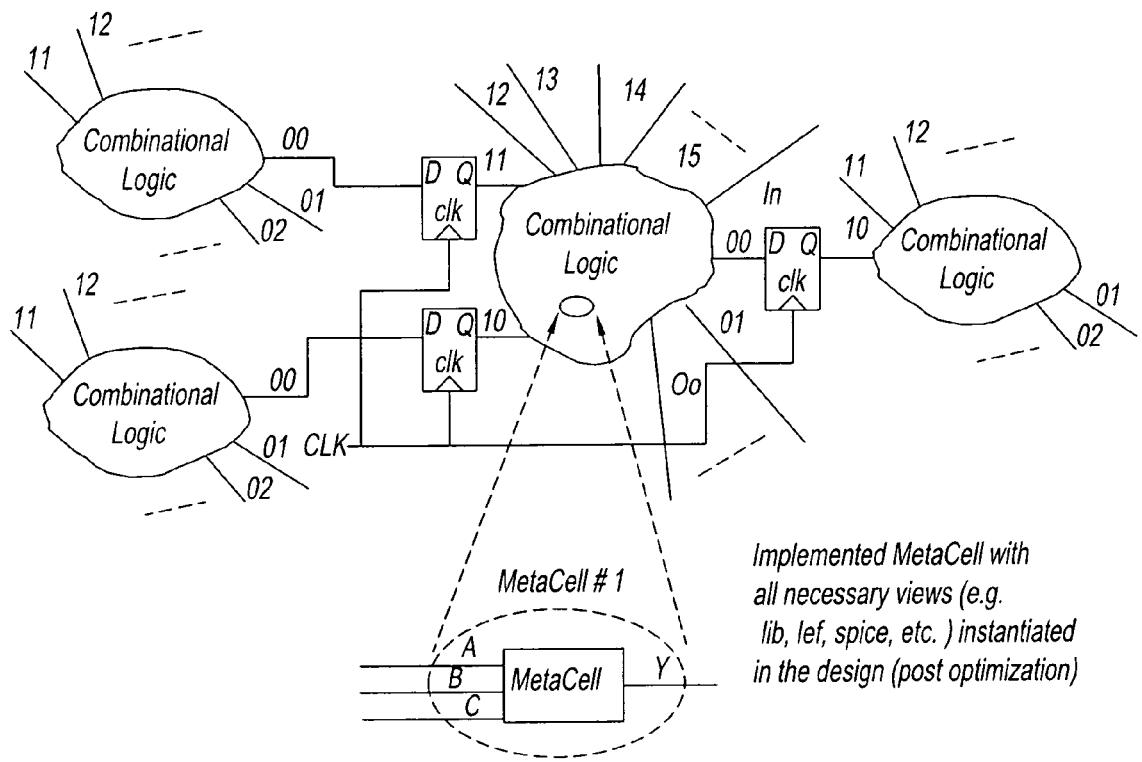
FIG. 16 shows instantiation of metacell created in FIG. 15 in the design netlist under design context and meeting the optimization objectives.

3. Mapping the cluster (e.g. cluster #1) to a metacell (to satisfy design constraints) using the post-layout patterns. FIG. 8 shows detailed transistor level view of a cluster (cluster #1 from FIG. 7) which is subsequently mapped to a metacell meeting the target optimization objectives. Post-layout patterns used for creation of metacells may come from either an existing standard cell library (100) or cache created in step 1 or both. This is primarily for the reason that standard cell library (100), however insufficient, can also be considered as a set of post-layout patterns. A new mapping technique (515), in contrast to prior art (see U.S. Pat. No. 7,003,738, "Process for automated generation of design-specific complex functional blocks to improve quality of synthesized digital integrated circuits in CMOS using altering process," Bhattacharya; Debashis, Boppana; Vamsi, Murgai; Rajeev, Roy; Rabindra) which is incorporated herein by reference in its entirety), is employed to take full advantage of patterns present in the cache, e.g., patterns with incomplete Boolean function, layout-only patterns, etc.; these patterns do not have any specific characteristics (e.g., timing, power, etc.), hence are not useful for generic synthesis purpose. But when instantiated (in a metacell) and used in design context by the proprietary mapping technology, they provide far more granular and precise control over the final characteristics of the metacells. The preferred mapping technology is one which employs unique Boolean function decomposition/factoring to create unique metacells, an example of which is shown in FIG. 9. FIG. 9 shows the mapped metacell (metacell #1) from the input cluster (cluster #1) which includes 5 cache pattern instances (also called components of a metacell), masters of which are AND-OR-INV pattern, NMOS finger layout pattern and INV pattern. Solid bounding box clearly distinguishes the metacell as a standard cell as opposed to a cluster shown in dotted bonding-box, which is a sub-section of netlist (hence a design level abstraction).

4. The metacell implementation (520) includes various physical (layout) transforms, such as, but not limited to, placement of patterns inside metacell, routing of wires inside metacell, via movement, diffusion changes, poly changes, etc. in order to achieve target optimization goal. The cache patterns (see FIGS. 10-11) in the metacell can be placed to realize a single height cell (see FIG. 12), or a multi height cell (see FIG. 13). The objectives for the placement task include congestion reduction, routability, etc., or a combination thereof. The internal nets in the metacell are routed (see FIG. 14) to satisfy a combination of cell-level and design-level objectives, such as, but not limited to, reduction of internal parasitics, via cost, strict conformance to cell design rules, route blockages, specific metal layer blockages, manufacturability, etc.

5. Physical verification in the form of DRC, LVS, etc. and extraction of the layout parasitics of the internal wires of metacell in the presence of underlying cache patterns. At the end of this step the constituent cache patterns become an integral part of the metacell.

6. Characterizing (525) the metacell using extracted parasitics to obtain timing, area, power, noise, etc., so as to fit into a standard cell-based design flow. The characteristics of the metacells (output of closed-loop process) are far more accurate than those obtained by prior approaches (output of open-loop process) because of the fact that the cache patterns already have accurate post-layout parasitics. An accurate circuit level simulator is used to derive the characteristics of created metacell; in contrast, prior approaches have mainly used a static timing analyzer to derive characteristics of design-specific standard cells. This is a key step that ensures accuracy of our closed-loop process at the same time a necessary one because of the use of layout-only, incomplete Boolean, etc. patterns inside metacell.

7. If the metacell so created does not satisfy the design- and context-specific constraints, further optimization in the form of metacell sizing (530) can be performed to improve the cell characteristics. This iterative process is based on post-layout patterns with certain regular fabric, such as, but not limited to, drive-strength variation, pull-up and pull-down ratio variation, etc. Such quantitative characteristics information of created cache patterns are built into the cache, and made available to proprietary mapping and sizing techniques to take full advantage of. This information is used to size the constituent components of a metacell, as well as individual transistors inside a metacell.

8. Steps (2) through (8) are repeated until the design-specific constraints or objectives are met. Once the design-specific objectives are met, additional characterization and view creation happen (FIG. 15) based on the requirement of the design-flow and the metacell is instantiated in the design netlist (FIG. 16) meeting target optimization objectives, thereby improving the design quality.

In another embodiment, the present disclosure discloses a manual approach to create design-specific metacells from cache patterns. In contrast to the automated method described in steps 1-8 above, the manual method is guided by an end user or entity. This is primarily to take advantage of any design-specific foreknowledge, technology know-how, specific customization requirement, etc. that are beyond the scope of an automated process, such as, but not limited to, create a metacell to enrich existing standard cell library based on layout patterns, create a metacell realizing a custom function form layout patterns for reuse across designs purpose, etc. In the manual method, part or whole of the set of steps 1-8 described above, are carried out by user-directives, whereas the rest of the steps (if any) are either carried out by the automated method described above, or not performed based on user directives.

While we have shown and described several embodiments in accordance with our invention, it is to be clearly understood that the same may be susceptible to numerous changes apparent to one skilled in the art. Therefore, we do not wish to be limited to the details shown and described but intend to show all changes and modifications that come within the scope of the appended claims.

What is claimed is:

1. A method for optimizing an integrated circuit design comprising:
    creating a cache of post-layout patterns;
    optimizing said integrated circuit design using said cache of post-layout patterns to create design-specific and context-specific standard cells,
        wherein said optimizing said integrated circuit design comprises:
        a. selecting a connected, multi-input, multi-output subset of said standard cells from said integrated circuit design, thereby creating a sub-network;
        b. defining constraints to be imposed on the sub-network from said integrated circuit design, and from the sub-network's local context within said integrated circuit design;
        c. creating one or more implementations of the sub-network using post-layout patterns from the cache of post-layout patterns;
        d. building a design-specific and context-specific standard cell for each implementation determined in the previous step;
        e. substituting a newly built design-specific and context-specific standard cell for the sub-network, thereby forming a modified network; and
        f. evaluating the characteristics of said modified network with the design-specific and context-specific standard cell, and determining whether to accept or reject the design-specific and context-specific standard cell substitution; and
    manufacturing an integrated circuit that uses said design-specific and context-specific standard cells.

2. The method according to claim 1, wherein the step of selecting uses at least one selection criteria selected from the group consisting of: the physical proximity of standard cells in said integrated circuit design, signal timing, timing criticality, power, area and noise.

3. The method according to claim 1, wherein said constraints imposed on said sub-network are at least one selected from the group consisting of: signal timing, input capacitance, area, noise and power.

4. The method according to claim 1, wherein the step of defining derives constraints from cell model characteristics of instances in said integrated circuit design, and from characteristics of said integrated circuit design as a whole, wherein said characteristics are selected from the group consisting of: signal timing, drive strength, physical location, area, power, noise and combinations thereof.

5. The method according to claim 1, wherein the step of defining derives constraints from standard cell model characteristics selected from the group consisting of: permissible number of fan outs, permissible transition times, delay, power, area, noise, and combinations thereof.

6. The method according to claim 1, wherein the step of creating comprising:
    a. creating one or more sets of post-layout patterns, where said patterns are taken from said post-layout cache, and where said patterns in each of said sets can be interconnected to produce the same function as the sub-network; and
    b. selecting one or more of said sets of post-layout patterns that satisfy some, or all, of said constraints placed on the sub-network.

7. The method according to claim 6, wherein the step of selecting uses at least one process selected from the group consisting of: placing the set of post-layout patterns, routing the interconnections between the post-layout patterns, polygon merging, polygon fracturing, extracting the circuit, extracting layout parasitics and simulating the interconnected post-layout patterns.

8. The method according to claim 6, wherein the step of selecting is based on at least one characteristic of said set of interconnected post-layout patterns selected from the group consisting of: signal timing, input capacitance, area, power and noise.

9. The method according to claim 8, wherein said characteristics are either estimated or evaluated accurately.

10. The method according to claim 1, wherein the step of building produces some or all of the representations required of a standard cell in the standard cell library, wherein said representations are at least one selected from the group consisting of: net list, signal timing, input capacitance, power, noise, area, layout geometry, and layout parasitics.

11. The method of claim 10, wherein said representations are as accurate as those in said standard cell library.

12. The method according to claim 1, wherein the step of evaluating uses at least one characteristic of the design selected from the group consisting of: signal timing, power, area and noise.

* * * * *